US006968523B2

(12) United States Patent
Masuda

(10) Patent No.: US 6,968,523 B2
(45) Date of Patent: Nov. 22, 2005

(54) DESIGN METHOD OF LOGIC CIRCUIT USING DATA FLOW GRAPH

(75) Inventor: Atsushi Masuda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 262 days.

(21) Appl. No.: 10/642,761

(22) Filed: Aug. 19, 2003

(65) Prior Publication Data

US 2004/0111684 A1 Jun. 10, 2004

(30) Foreign Application Priority Data

Dec. 5, 2002 (JP) ............................ 2002-354208

(51) Int. Cl.[7] ............................................... G06F 17/50
(52) U.S. Cl. .................... 716/6; 716/1; 716/18; 703/14
(58) Field of Search ..................... 716/1, 6, 18; 703/14

(56) References Cited

U.S. PATENT DOCUMENTS 5,175,843 A * 12/1992 Casavant et al. .............. 716/6
5,706,205 A 1/1998 Masuda et al. ............... 716/18
6,237,125 B1 5/2001 Masuda et al. ................ 716/1

OTHER PUBLICATIONS

Dr. Sreenivasa Rao, et al., "Partitioning by Regularity Extraction", 29th ACM/IEEE Design Automation Conference, Jun. 8-12, 1992, pp. 235-238.

* cited by examiner

*Primary Examiner*—Thuan Do
(74) *Attorney, Agent, or Firm*—Oblon, Spivak, McClelland, Maier & Neustadt, P.C.

(57) ABSTRACT

An algorithm of a logic circuit is converted from an operation description having operators into a data flow graph having operation nodes executing the operators arranged in order of the executing. Execution steps are allocated in the data flow graph, and registers storing output data from the operation nodes are inserted after execution of the execution steps. A data path of the logic circuit having operation units which served as the operation nodes and storage elements which served as the registers, and control information on the data path are produced. An operator/operation unit database configured to retrieve the operation units executing the operators from the operators and configured to retrieve the operators outputting data stored in the registers which served as the storage elements from the execution steps and the storage elements are produced.

12 Claims, 10 Drawing Sheets

```
void calc (int i1, int i2, int &o1)
{
     o1 = (i1 + i2) * (i1 - i2) + 1 ;
}            op1    op2   op3    op4
```

D7

21

| NODE | OPERATOR |
|---|---|
| N1 | op1 |
| N2 | op3 |
| N3 | op2 |
| N4 | op4 |
| | |
| R1 | op1 |
| R2 | op3 |
| R3 | op2 |
| R4 | op4 |

22 23

D8

| EXECUTION STEP / OPERATION UNIT | 1 | 2 | 3 |
|---|---|---|---|
| A1 | N1 | | N4 |
| A2 | N2 | | |
| A3 | | N3 | |
| | | | |
| M1 | R1 | R3 | R4 |
| M2 | R2 | | |

24 (row A1); 25 (operation unit column); 26 (execution step columns); 27 (header row)

FIG. 10

| EXECUTION STEP / OPERATION UNIT | 1 | 2 | 3 |
|---|---|---|---|
| A1 | op1 | | op4 |
| A2 | op3 | | |
| A3 | | op2 | |
| | | | |
| M1 | op1 | op2 | op4 |
| M2 | op3 | | |

| OPERATOR / (i1, i2) | op1 | op2 | op3 | op4 |
|---|---|---|---|---|
| (2, 1) | 3 | 3 | 1 | 4 |
| (3, 2) | 5 | 5 | 1 | 6 |
| (2, 3) | 5 | −5 | −1 | −4 |

| EXECUTION STEP / (i1, i2) | | 1 | 2 | 3 |
|---|---|---|---|---|
| (2, 1) | M1 | 3 | 3 | 4 |
| | M2 | 1 | | |
| (3, 2) | M1 | 5 | 5 | 6 |
| | M2 | 1 | | |
| (2, 3) | M1 | 5 | 1275 | 1276 |
| | M2 | −1 | | |

34, 35, 36, D13, D11

```
void calc (int i1, int i2, int i3, int i4, int &o1)
{
      o1 = i1 + i2 + i3 + i4 ;
}              op1  op2  op3
```

21 — D7

| NODE | OPERATOR |
|---|---|
| N1 | op1 |
| N2 | op2 |
| N3 | op3 |
| | |
| R1 | op1 |
| R2 | op2 |
| R3 | op3 |

22 23

| NODE | OPERATOR |
|---|---|
| N1 | op1 |
| N2 | op2 |
| N3 | op3 |
| N4 | op2, op3 |
| N5 | op2, op3 |
| | |
| R1 | op1 |
| R2 | op2 |
| R3 | op2, op3 |
| R4 | op2, op3 |

D7

22 23

D8

| OPERATION UNIT \ EXECUTION STEP | 1 | 2 |
|---|---|---|
| A1 | N1 | N5 |
| A2 | N4 | |
| | | |
| M1 | R1 | R3 |
| M2 | R4 | |

24, 25, 26, 27

D9

| OPERATION UNIT \ EXECUTION STEP | 1 | 2 |
|---|---|---|
| A1 | op1 | op2, op3 |
| A2 | op2, op3 | |
| | | |
| M1 | op1 | op2, op3 |
| M2 | op2, op3 | |

28, 29, 30, 31

DESIGN METHOD OF LOGIC CIRCUIT USING DATA FLOW GRAPH

CROSS REFERENCE TO RELATED APPLICATIONS

This application is based upon and claims the benefit of priority from prior Japanese Patent Application No. P2002-354208, filed on Dec. 5, 2002; the entire contents of which are incorporated herein by reference.

BACKGROUND OF THE INVENTION

1. Field of the Invention

The present invention relates to a high level synthesizing technique for automatically generating a register transfer level (abbreviated as "RTL") description and, more particularly, to a design method of a logic circuit for converting an operation description into an RTL description.

2. Description of the Related Art

In a logic circuit design of the prior art, a table showing the correspondence between an intermediate signal in an operation description and an operation unit for a logic circuit has been developed.

However, in a higher level synthesized RTL description, data has been stored in a storage element for each execution step, and then, one operation unit has repeated the operations. Therefore, a table has not been provided which shows the correspondence therebetween, and further, no table has been provided showing the correspondence per each execution step. In the case where there is a failure in a simulation result of a logic circuit of the RTL description, a designer has analyzed the simulation result by using only the RTL description. Since the RTL description has been varied at an operating location according to an operating time or condition, such an analysis has taken a great deal of time.

SUMMARY OF THE INVENTION

A computer-implemented design method of a logic circuit according to embodiments of the present invention includes converting an algorithm of the logic circuit from an operation description having operators into a data flow graph having operation nodes executing the operators arranged in order of the executing, allocating execution steps in the data flow graph, inserting registers storing output data from the operation nodes after execution of the execution steps, producing a data path of the logic circuit having operation units which served as the operation nodes and storage elements which served as the registers, and control information on the data path, and producing an operator/operation unit database configured to retrieve the operation units executing the operators from the operators and configured to retrieve the operators outputting data stored in the registers served as the storage elements from the execution steps and the storage elements.

A computer program product to be executed by a computer for designing a logic circuit, and the computer program product design method of a logic circuit according to embodiments of the present invention includes instructions configured to convert an algorithm of the logic circuit from an operation description having operators into a data flow graph having operation nodes executing the operators arranged in order of the executing, instructions configured to allocate execution steps in the data flow graph, inserting registers storing output data from the operation nodes after execution of the execution steps, instructions configured to produce a data path of the logic circuit having operation units which served as the operation nodes and storage elements which served as the registers, and control information on the data path, and instructions configured to produce an operator/operation unit database configured to retrieve the operation units executing the operators from the operators and to retrieve the operators outputting data stored in the registers which served as the storage elements from the execution steps and the storage elements.

An apparatus for designing a logic circuit according to embodiments of the present invention includes a syntax analyzing unit configured to convert an algorithm of the logic circuit from an operation description having operators into a data flow graph having operation nodes executing the operators arranged in order of the executing, a scheduling unit configured to allocate execution steps in the data flow graph, and inserting registers storing output data from the operation nodes after execution of the execution steps, a hardware allocating unit configured to produce a data path of the logic circuit having operation units which served as the operation nodes and storage elements which served as the registers, and control information on the data path, and a correspondence information analyzing unit configured to produce an operator/operation unit database configured to retrieve the operation units executing the operators from the operators and to retrieve the operators outputting data stored in the registers which served as the storage elements from the execution steps and the storage elements.

BRIEF DESCRIPTION OF DRAWINGS

FIG. 10 is a table illustrating the data structure of an operator/operation unit database in the first embodiment;

FIG. 11 is a diagram illustrating a simulation result of an operation description in the first embodiment;

FIG. 12 is a diagram illustrating a simulation result of an RTL description in the first embodiment;

DETAILED DESCRIPTION OF THE INVENTION

Figure 1:
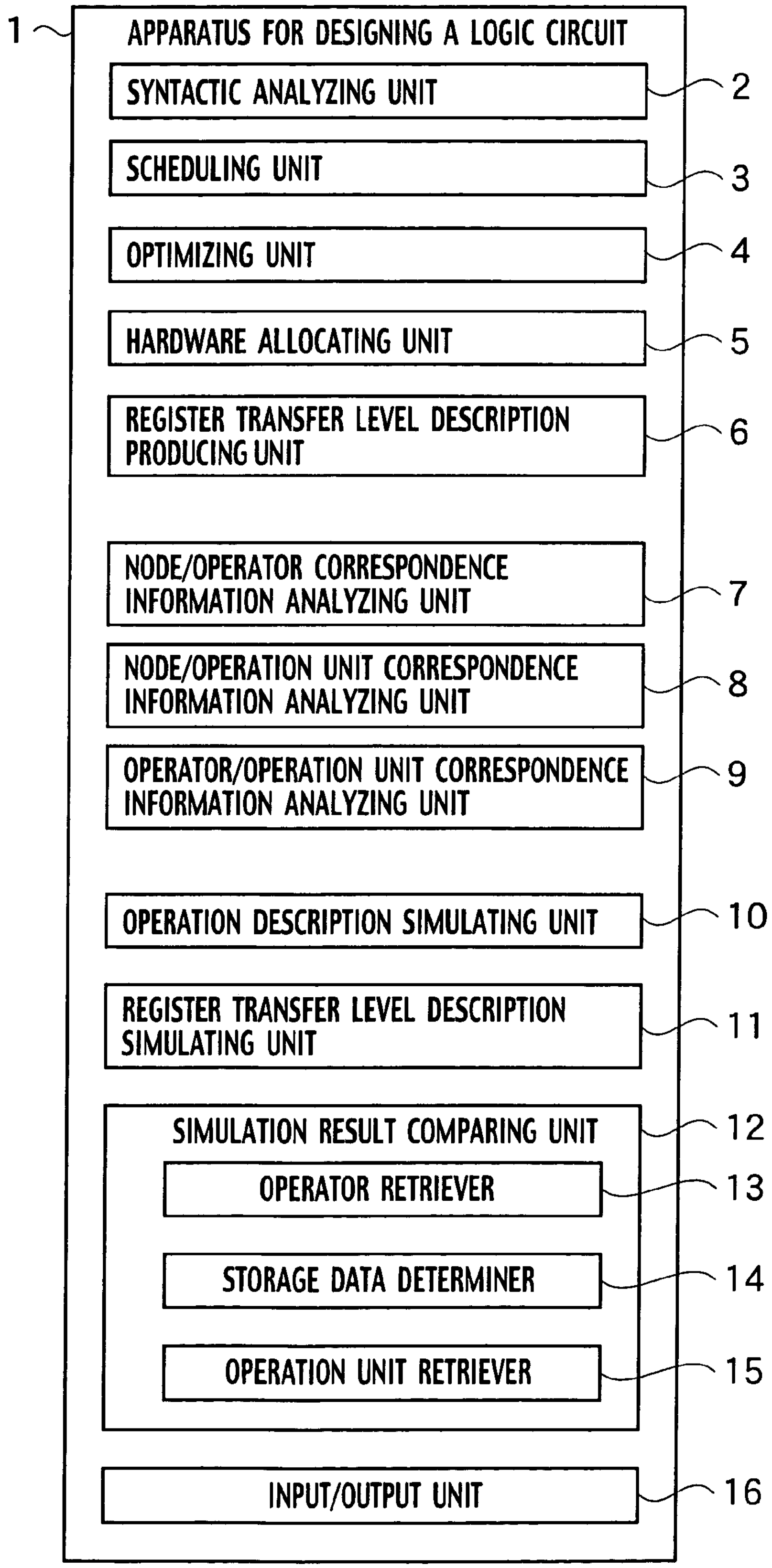
FIG. 1 is a diagram illustrating the configuration of an apparatus for designing a logic circuit in embodiments according to the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

[Apparatus for Designing Logic Circuit]

As illustrated in FIG. 1, a apparatus 1 for designing a logic circuit in embodiments according to the present invention comprises: a syntactic analyzing unit 2, a scheduling unit 3, an optimizing unit 4, a hardware allocating unit 5, an RTL description producing unit 6, a node/operator correspondence information analyzing unit 7, a node/operation unit correspondence information analyzing unit 8, an operator/operation unit correspondence information analyzing unit 9, an operation description simulating unit 10, an RTL description simulating unit 11, a simulation result comparing unit 12 and an input/output unit 16. The simulation result comparing unit 12 includes an operator retriever 13, a storage data determiner 14 and an operation unit retriever 15.

Figure 2:
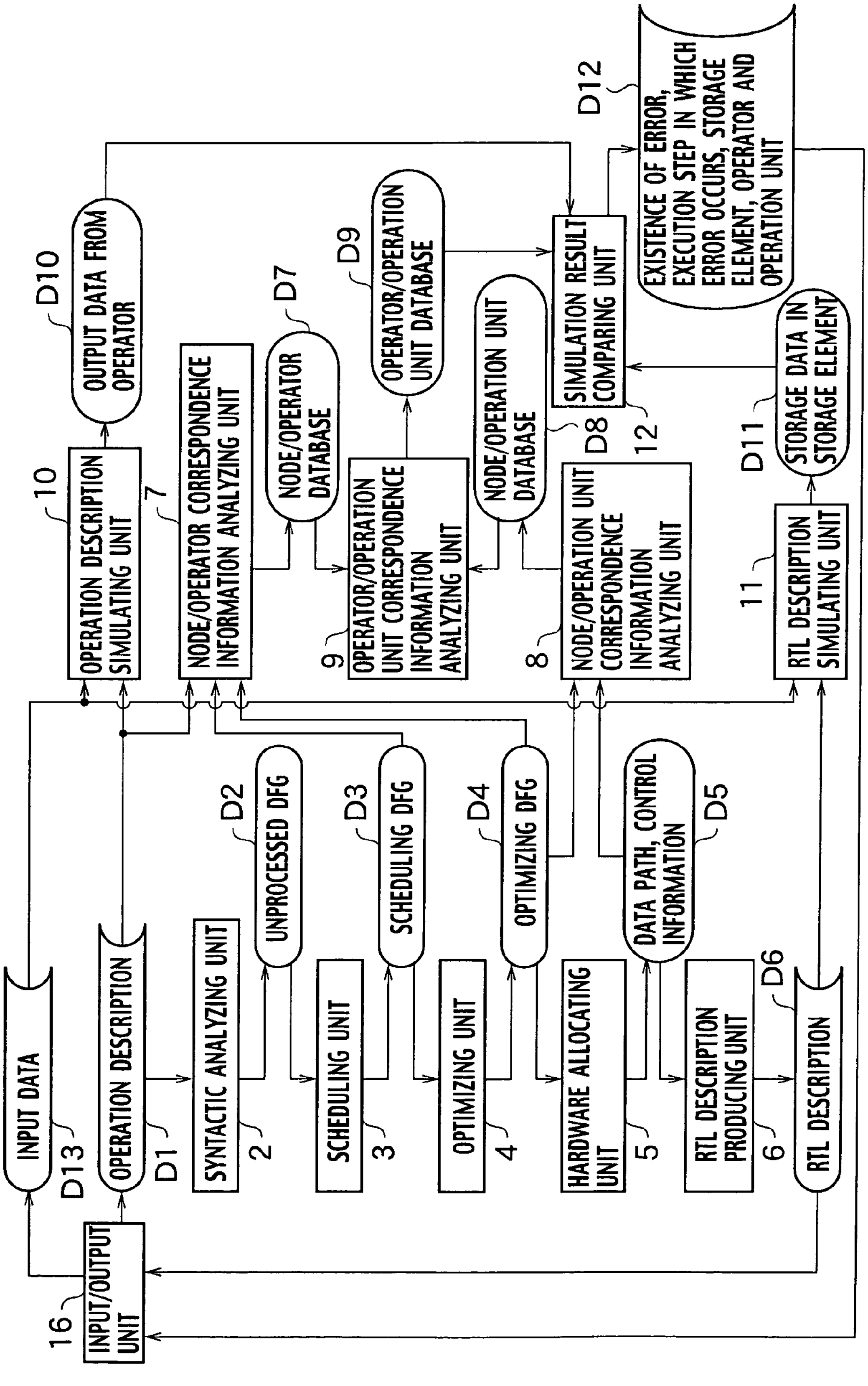
FIG. 2 is a diagram illustrating the flow of data in the apparatus for designing a logic circuit in the embodiments according to the present invention.

As illustrated in FIG. 2, the syntactic analyzing unit 2 receives an operation description D1. The operation description D1 represents an algorithm of a logic circuit, and has a plurality of operators. The syntactic analyzing unit 2 outputs an unprocessed data flow graph (abbreviated as "DFG") D2. In the unprocessed data flow graph D2, operation nodes for executing operators are arranged in order of execution.

The scheduling unit 3 receives the unprocessed data flow graph D2. The scheduling unit 3 allocates an execution step in the unprocessed data flow graph D2. The scheduling unit 3 inserts a register for storing therein output data from the operation node after the execution of the execution step in the unprocessed data flow graph D2. The scheduling unit 3 outputs a scheduling data flow graph D3.

The optimizing unit 4 receives the scheduling data flow graph D3. The optimizing unit 4 varies the scheduling data flow graph D3 in such a manner that the entire expected execution time of the algorithm of the logic circuit is set to the shortest possible time. The optimizing unit 4 outputs an optimizing data flow graph D4.

The hardware allocating unit 5 receives the optimizing data flow graph D4. The hardware allocating unit 5 produces a data path and control information D5 on the data path. The data path D5 is a data path in a logic circuit having an operation unit functioning as an operation node and a storage element functioning as a register.

The RTL description producing unit 6 receives the data path and the control information D5. The RTL description producing unit 6 produces an RTL description D6 for the logic circuit based on the data path and the control information D5. Thereafter, the RTL description producing unit 6 outputs the RTL description D6.

The node/operator correspondence information analyzing unit 7 receives the operation description D1, the scheduling data flow graph D3 and the optimizing data flow graph D4. The node/operator correspondence information analyzing unit 7 produces a node/operator database D7 based on the operation description D1, the scheduling data flow graph D3 and the optimizing data flow graph D4. An operator to be executed at the operation node can be retrieved from the operation node in the node/operator database D7. In the node/operator database D7, the operator to be executed at the operation node for outputting data stored in the register can be retrieved from the register.

The node/operation unit correspondence information analyzing unit 8 receives the optimizing data flow graph D4 and the data path D5. The node/operation unit correspondence information analyzing unit 8 produces a node/operation unit database D8 based on the optimizing data flow graph D4 and the data path D5. In the node/operation unit database D8, the operation unit functioning as the operation node can be retrieved from the operation node. In the node/operation unit database D8, the register functioning as the storage element can be retrieved from the execution step and the storage element.

The operator/operation unit correspondence information analyzing unit 9 receives the node/operator database D7 and the node/operation unit database D8. The operator/operation unit correspondence information analyzing unit 9 produces an operator/operation unit database D9 based on the node/operator database D7 and the node/operation unit database D8. In the operator/operation unit database D9, the operation unit for executing the operator can be retrieved from the operator. In the operator/operation unit database D9, the operator for outputting data stored in the register functioning as the storage element can be retrieved from the execution step and the storage element.

The operation description simulating unit 10 receives the operation description D1 and input data D13. The operation description simulating unit 10 substitutes the input data D13 in the operation description D1, thereby calculating output data D10 from the operator.

The RTL description simulating unit 11 receives the RTL description D6 and the input data D13. The RTL description simulating unit 11 substitutes the input data D13 in the RTL description D6. The RTL description simulating unit 11 calculates storage data D11 stored in the storage element per each execution step.

The operator retriever 13 in the simulation result comparing unit 12 receives the operator/operation unit database D9. The operator retriever 13 receives the execution step and the storage element, in which the storage data D11 is stored. The operator retriever 13 retrieves the operator from the execution step, in which the storage data D11 is calculated, and the storage element based on the operator/operation unit database D9.

The storage data determiner 14 in the simulation result comparing unit 12 receives the storage data D11 and output data from the retrieved operator. The storage data determiner 14 determines whether the output data from the retrieved operator and the storage data are the same as or different from each other. If the output data from the retrieved operator is different from the storage data, it is determined that there is a failure in the RTL description D6. The storage data determiner 14 outputs a failure existence D12 in the RTL description D6 as the determination result. If there is a failure in the RTL description D6, the storage data determiner 14 further outputs an execution step, the storage element and an operator D12, in which the storage data D11 is stored.

The operation unit retriever 15 in the simulation result comparing unit 12 receives the operator/operation unit database D9 and the retrieved operator if the output data from the retrieved operator is different from the storage data. The operation unit retriever 15 retrieves the operator from the retrieved operator based on the operator/operation unit database D9. The operation unit retriever 15 outputs a retrieved operation unit D12.

The input/output unit 16 receives the operation description D1 and the input data D13. The input/output unit 16 outputs the RTL description D6 and the existence of a failure in the RTL description D6, the execution step in which the failure occurs, the storage element, the operator and the operation unit D12.

When the RTL description D6 is produced from the operation description D1 such as a C description in high level synthesis, the operator/operation unit database D9 for allowing the operation description D1 to correspond to the RTL description D6 is produced. A test vector for use in verifying the operation description D1 can be used for the verification of the RTL description D6. Furthermore, the RTL description D6 is compared with and verified by the operation description D1 to verify the RTL description D6, and thus, faulty portions can be specified in both of the operation description D1 and the RTL description D6 in the case where a failure occurs. Consequently, it is possible to readily correct the operation description D1 and the RTL description D6. Thus, it is possible to remarkably shorten the time required for design, verification and correction of a failure.

The apparatus 1 for designing the logic circuit may be a computer, or the apparatus may be implemented by allowing a computer to execute procedures written in a program.

[Design Method of Logic Circuit]

Figure 3:
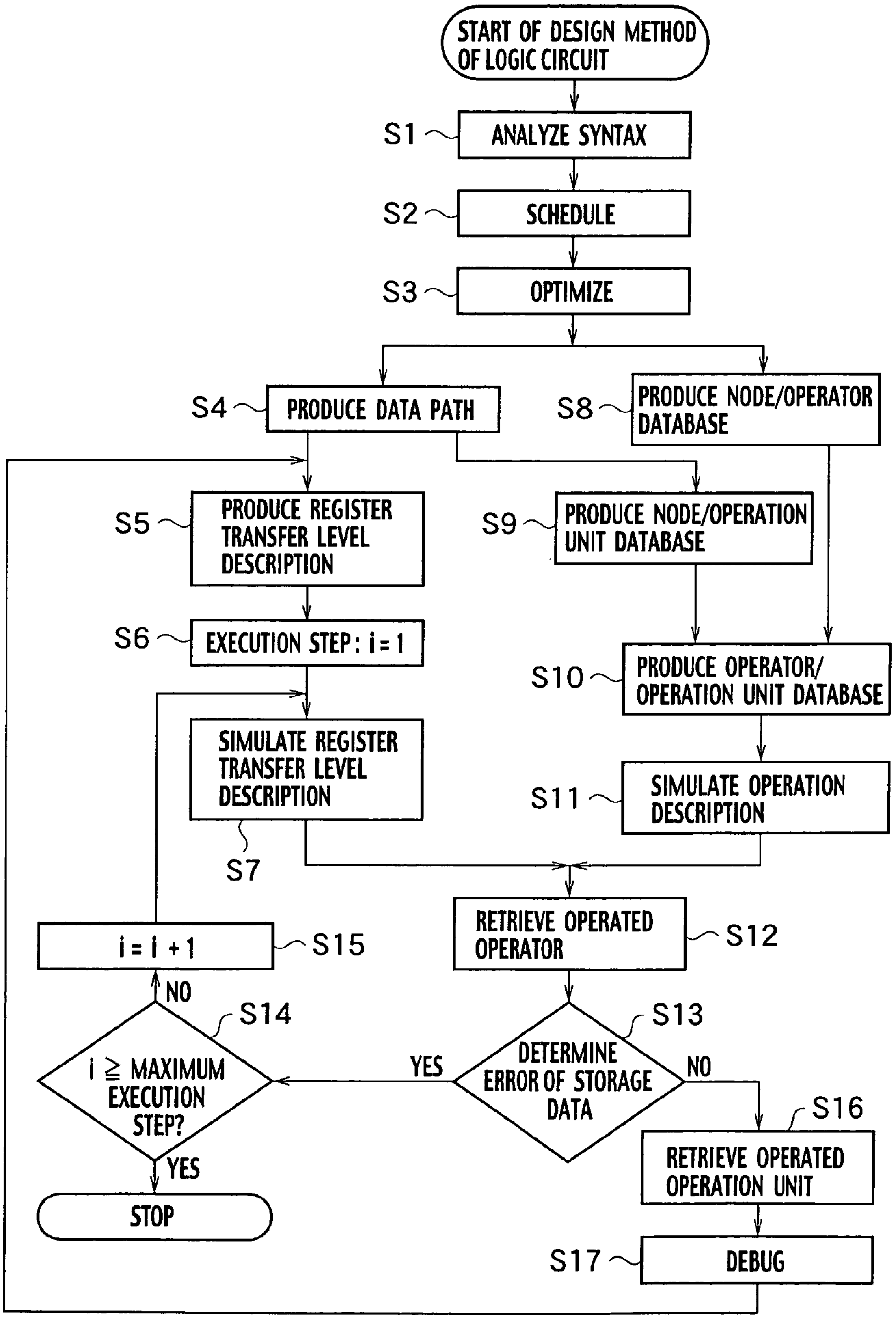
FIG. 3 is a flowchart illustrating a design method of a logic circuit in the embodiments according to the present invention.

As illustrated in FIG. 3, in a design method of a logic circuit in the embodiments according to the present invention, the syntactic analyzing unit 2 analyzes syntax in step S1. The syntactic analyzing unit 2 converts the algorithm of the logic circuit from the operation description D1 into the unprocessed data flow graph D2. The operation description D1 has a plurality of operators. In the unprocessed data flow graph D2, the operation nodes for executing the operators are arranged in order of execution.

In step S2, the scheduling unit 3 performs scheduling. The scheduling unit 3 allocates the execution steps in the unprocessed data flow graph D2. The scheduling unit 3 attaches, to the operation node, time information as to an execution step in which processing is executed. The scheduling unit 3 inserts, in the unprocessed data flow graph D2, a register for storing therein the output data from the operation node after the execution of the execution step. Data across the execution steps can be held by this register. The scheduling unit 3 outputs the unprocessed data flow graph D2, which has been processed in the above-described manner, as the scheduling data flow graph D3.

In step S3, the optimizing unit 4 varies the scheduling data flow graph D3 in such a manner that the entire expected execution time will be the shortest time possible. The optimizing unit 4 outputs the scheduling data flow graph D3, which has been varied in the above-described manner, as the optimizing data flow graph D4.

In step S4, the hardware allocating unit 5 produces the data path in the logic circuit and the control information D5 on the data path. The logic circuit includes the operation unit and the register. The operation unit functions as the operation node. The storage element functions as the register.

In step S5, the RTL description producing unit 6 produces the RTL description D6 based on the data path and the control information D5.

In step S6, the RTL description simulating unit 11 sets an execution step 1, which is first executed as an execution step i.

In step S7, the RTL description simulating unit 11 simulates the RTL description D6. The input data D13 is substituted into the RTL description D6, and then, the data output from the operation unit and the storage data D11 stored in the storage element are calculated in the execution step i.

In step S8 after the execution of steps S2 and S3, the node/operator correspondence information analyzing unit 7 produces the node/operator database D7 based on the operation description D1, the scheduling data flow graph D3 and the optimizing data flow graph D4.

In step S9 after the execution of step S4, the node/operation unit correspondence information analyzing unit 8 produces the node/operation unit database D8 based on the optimizing data flow graph D4 and the data path D5.

In step S10, the operator/operation unit correspondence information analyzing unit 9 produces the operator/operation unit database D9 based on the node/operator database D7 and the node/operation unit database D8.

In step S11, the operation description simulating unit 10 simulates the operation description D1. The operation description simulating unit 10 substitutes the input data D13 into the operation description D1, thereby calculating the output data D10 from the operator. The operation description simulating unit 10 calculates intermediate data output from each of the operators in the case where the operation description is actually compiled and executed.

In step S12, after the execution of steps S7 and S11, the operator retriever 13 in the simulation result comparing unit 12 retrieves the operator from the execution step i in the storage data D11 and the storage element based on the operator/operation unit database D9.

In step S13, the storage data determiner 14 determines whether the output data D10 from the retrieved operator is the same as or different from the storage data D11. If the result is that they are different from each other, the control routine proceeds to step S16. In contrast, if the result is that they are the same as each other, the control routine proceeds to step S14.

In step S16, the operation unit retriever 15 retrieves the operation unit from the retrieved operator based on the operator/operation unit database D9.

In step S17, the apparatus 1 for designing the logic circuit or its user debugs the RTL description D6 based on the retrieved operation unit. Thereafter, the control routine returns to step S5. Here, the step to which the control routine returns is not always step S5. If the RTL description which is subjected to simulation again is the debugged RTL description, the control routine may return to step S6.

In contrast, in step S14, the simulation result comparing unit 12 determines whether or not the execution step i is a maximum execution step or greater in the optimizing data flow graph D4. Unless the execution step i is the maximum execution step or greater, the control routine proceeds to step S15. In step S15, the execution step i is incremented by one. Thereafter, the control routine proceeds to step S7. If the execution step i is the maximum execution step or greater, the design method of the logic circuit is stopped. In this manner, the output data D10 from the operator as the simulation result of the operation description D1 is compared with the storage data D11 stored in the storage element as the simulation result of the RTL description D6 per the execution step, so that the operation description is compared with and verified by the high-level synthesized RTL description.

By the comparison and verification between the operation description D1 and the RTL description, it is possible to specify faulty portions in both of the operation description D1 and the RTL description D6 if a failure occurs. In this manner, it is possible to readily correct the operation description D1 or the RTL description D6, thereby remarkably shortening the time required for the design, verification or failure correction.

In the simulation of the RTL description D6, the simulation is performed while the data is compared per each execution step. The simulation is not limited to the above-described manner, the operation description D1 and the RTL description may be compared and verified after the execution of all of the execution steps of the RTL description D6. Here, a failure in the preceding execution step may cause a failure in the following execution step; in contrast, a debug of a failure in the preceding execution step may cause a failure in the following execution step. Therefore, it is desirable that a timing of the comparison and verification between the operation description D1 and the RTL description should be set per each execution step or should be changed after the execution of all of the execution steps.

The design method of the logic circuit can be represented by a computer executable logic circuit design program. The logic circuit design program is executed by a computer, whereby the design method of the logic circuit can be carried out.

[First Embodiment]

Figures 4, 5:
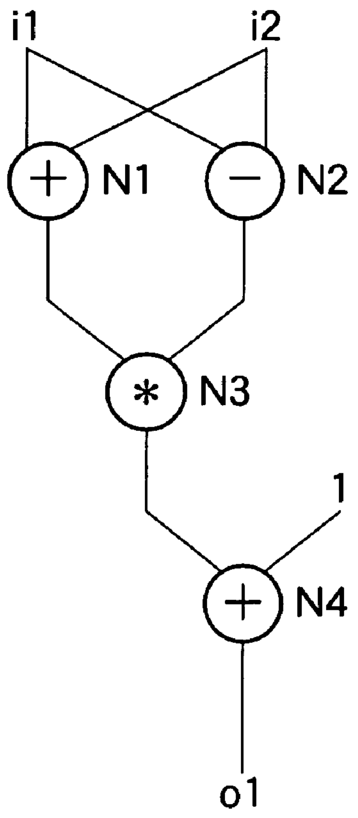
FIG. 4 illustrates an operation description in a first embodiment.
FIG. 5 is a diagram illustrating an unprocessed data flow graph (abbreviated as "DFG") in the first embodiment.

In a first embodiment, the design method of the logic circuit illustrated in FIG. 3 is used in the apparatus 1 for designing the logic circuit illustrated in FIG. 1. In the design method of the logic circuit in the first embodiment, in step S1 illustrated in FIG. 3, the operation description D1 having a plurality of operators op1 to op4 illustrated in FIG. 4 is converted into the unprocessed data flow graph D2 in which operation nodes N1 to N4 for executing the operators op1 to op4 are arranged in order of execution, as illustrated in FIG. 5. The operators op1 to op4 are actually managed as inside data, and the operators are recognized by identification numbers, pointers or the like. With respect to operands i1 and i2 in the input data D13, the operator op1 for an addition is executed at the operation node N1. With respect to the operands i1 and i2, the operator op3 for a subtraction is executed at the operation node N2. With respect to an output from the operator op1 at the operation node N1 and an output from the operator op2 at the operation node N2, the operator op2 for a multiplication is executed at the operation node N3. With respect to an output from the operator op2 at the operation node N3 and a constant 1, the operator op4 for an addition is executed at the operation node N4.

Figures 6, 7:
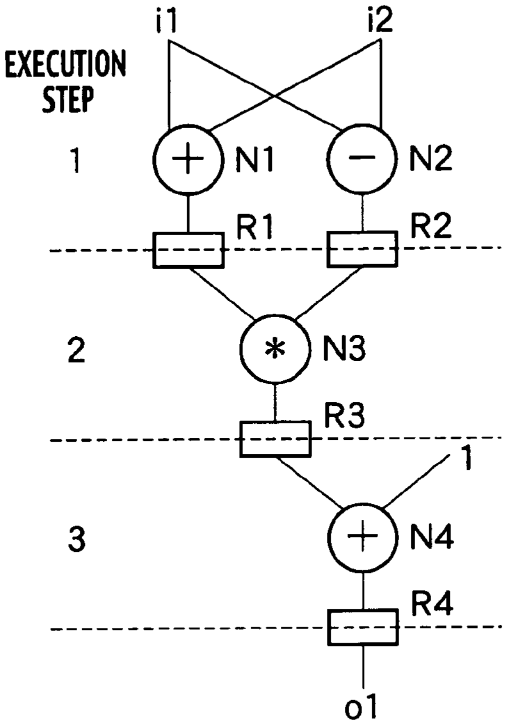
FIG. 6 is a diagram illustrating a DFG after scheduling in the first embodiment.
FIG. 7 is a table illustrating the data structure of a node/operator database in the first embodiment.

In step S2, execution steps 1 to 3 are allocated in the unprocessed data flow graph D2 illustrated in FIG. 5, as illustrated in FIG. 6. Time information showing that the operation nodes N1 and N2 are executed in the execution step 1 is attached as is time information that the operation node N3 is executed in the execution step 2 and time information that the operation node N4 is executed in the execution step 3 is attached. Registers R1 to R4 for storing therein output data from the operation nodes N1 to N4, respectively, are inserted after the execution of the execution steps 1 to 3 in the unprocessed data flow graph D2. The scheduling unit 3 outputs the unprocessed data flow graph D2 illustrated in FIG. 5, which has been processed in the above-described manner, as the scheduling data flow graph D3 illustrated in FIG. 6.

In step S3, the scheduling data flow graph D3 is optimized. Since the expected entire execution time has already been made to the shortest time, the output optimized data flow graph D4 is the same as the scheduling data flow graph D3.

In step S8, the node/operator database D7 illustrated in FIG. 7 is produced based on the operation description D1 illustrated in FIG. 4 and the scheduling data flow graph D3 illustrated in FIG. 6. The node/operator database D7 has a plurality of node/operator records 21. The node/operator record 21 has a node field 22 and an operator field 23. The operation nodes N1 to N4 and the registers R1 to R4 are stored in the node field 22. The operators op1 to op4 are stored in the operator field 23. The operators op1 to op4 and the operation nodes N1 to N4 for executing the operators op1 to op4 are stored in the same node/operator records 21, respectively. Furthermore, the operators op1 to op4 and the registers R1 to R4 for storing therein the output data from the operators op1 to op4 are stored in the same node/operator records 21, respectively. The operators op1 to op4 stored in the same node/operator records 21, respectively, can be retrieved from the operation nodes N1 to N4 or the registers R1 to R4.

Figures 8, 9:
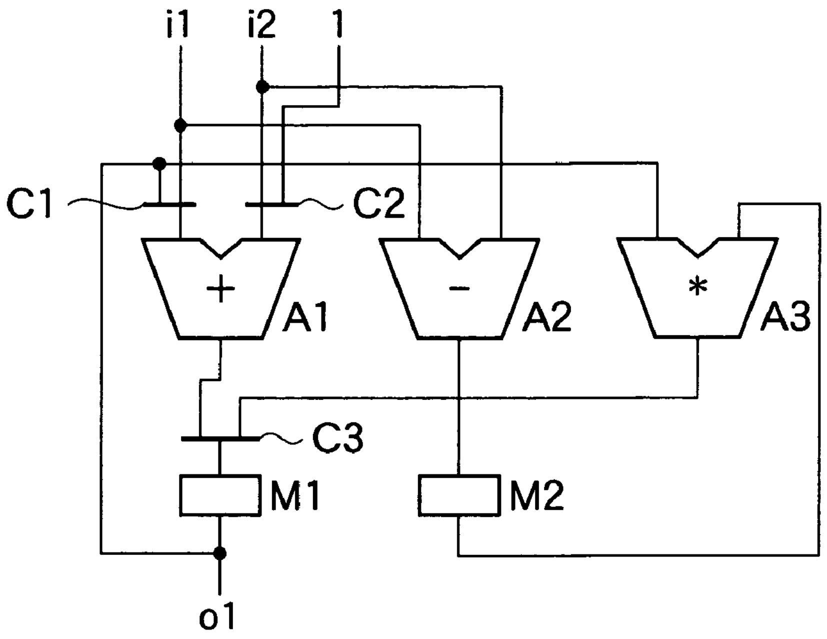
FIG. 8 is a diagram illustrating a data path in the first embodiment.
FIG. 9 is a table illustrating the data structure of a node/operation unit database in the first embodiment.

In step S4, the hardware allocating unit 5 produces the data path D5 in the logic circuit and the control information D5 on the data path, as illustrated in FIG. 8. The data path D5 includes operation units A1 to A3 functioning as the operation nodes N1 to N4, storage elements M1 and M2 functioning as the registers R1 to R4, and selectors C1 to C3 for switching data to be transmitted based on the control information D5.

In step S9, the node/operation unit database D8 illustrated in FIG. 9 is produced based on the scheduling data flow graph D3 illustrated in FIG. 6 and the data path D5 illustrated in FIG. 8. The node/operation unit database D8 includes a plurality of node/operation unit records 24. The node/operation unit record 24 has an operation unit field 25, a node field 26 and an execution step field 27. The operation units A1 to A3 and the storage elements M1 and M2 are stored in the operation field 25. The operation nodes N1 to N4 and the registers R1 to R4 are stored in the node field 22. The execution steps 1 to 3 are stored in the execution step field 27. The operation units A1 to A3, the operation nodes N1 to N4 executed in the operation units A1 to A3 and the execution steps, in which the operation nodes N1 to N4 are executed, are stored in the same node/operation unit records 24, respectively. Furthermore, the storage elements M1 and M2, the registers R1 to R4 stored in the storage elements M1 and M2, respectively, and the execution steps, in which the registers R1 to R4 store, are stored in the same node/operation unit records 24, respectively.

Specifically, when upon study of the node/operation unit database D8 illustrated in FIG. 9 in reference to the scheduling data flow graph D3 illustrated in FIG. 6 and the data path D5 illustrated in FIG. 8, in the execution step 1, the operation unit A1 functions as the operation node N1, the operation unit A2 functions as the operation node N2, the operation unit A3 is not operated, the storage element M1 functions as the register R1, and the storage element M2 functions as the register R2. In the execution step 2, the operation units A1 and A2 are not operated, the operation unit A3 functions as the operation node N3, the storage element M1 functions as the register R3, and the storage element M2 is not operated. In the execution step 3, the operation unit A1 functions as the operation node N4, the operation units A2 and A3 are not operated, the storage element M1 functions as the register R4, and the storage element M2 is not operated.

In accordance with the node/operation unit database D8 illustrated in FIG. 9, the operation units A1 to A3 stored in the same node/operation unit records 24, respectively, can be retrieved from the operation nodes N1 to N4. Furthermore, the registers R1 to R4 stored in the same node/operation unit records 24, respectively, can be retrieved from the storage elements M1 and M2 and the execution steps 1 to 3.

In step S10, the operator/operation unit database D9 illustrated in FIG. 10 is produced based on the node/operator database D7 illustrated in FIG. 7 and the node/operation unit database D8 illustrated in FIG. 9. The operator/operation unit database D9 includes a plurality of operator/operation unit records 28. The operator/operation unit records 28 have an operation unit field 29, an operator field 30 and an execution step field 31. The operation units A1 to A3 and the storage elements M1 and M2 are stored in the operation unit field 29. The operators op1 to op4 are stored in the operator field 30. The execution steps 1 to 3 are stored in the execution step field 31. The operation units A1 to A3, the operators op1 to op4 executed in the operation units A1 to A3 and the execution steps, in which the operators op1 to op4 are executed, are stored in the same operator/operation unit records 28, respectively. Furthermore, the storage elements M1 and M2, the operators op1 to op4 for outputting data, which are stored in the storage elements M1 and M2, and the execution steps, in which the operators op1 to op4 are executed, are stored in the same operator/operation unit records 28, respectively.

Specifically, upon study of the operator/operation unit database D9 illustrated in FIG. 10 in reference to the node/operator database D7 illustrated in FIG. 7 and the node/operation unit database D8 illustrated in FIG. 9, in the execution step 1, the operation unit A1 functions as the operator op1, the operation unit A2 functions as the operator op3, the operation unit A3 is not operated, the storage element M1 stores therein the data output from the operator op1, and the storage element M2 stores therein the data output from the operator op3. In the execution step 2, the operation units A1 and A2 are not operated, the operation unit A3 functions as the operator op2, the storage element M1 stores therein the data output from the operator op2, and the storage element M2 is not operated. In the execution step 3, the operation unit A1 functions as the operator op4, the operation units A2 and A3 are not operated, the storage element M1 stores therein the data output from the operator op4, and the storage element M2 is not operated.

In accordance with the operator/operation unit database D9 illustrated in FIG. 10, the operation units A1 to A3 stored in the same operator/operation unit records 28, respectively, can be retrieved from the operators op1 to op4. Furthermore, the operators op1 to op4 stored in the same operator/operation unit records 28, respectively, can be retrieved from the storage elements M1 and M2 and the execution steps 1 to 3.

In step S11, the operation description D1 is simulated. As illustrated in FIG. 11, constant values 2 and 1 as the input data D13 are substituted into the operands i1 and i2, respectively, in the operation description D1 illustrated in FIG. 4. Then, constant value 3 is output as the output data D10 from the operator op1. In the same manner, constant values 3, 1 and 4 are output as the output data D10 from the operators op2, op3 and op4, respectively.

Next, constant values 3 and 2 are substituted into the operands i1 and i2 in the operation description D1, respectively and constant Values 5, 5, 1 and 6 are output as the output data D10 from the operators op1, op2, op3 and op4, respectively. Moreover, constant values 2 and 3 are substituted into the operands i1 and i2 in the operation description D1, respectively. Further constant values 5, −5, −1 and −4 are output as the output data D10 from the operators op1, op2, op3 and op4, respectively.

As illustrated in FIG. 11, the input data D13 and the output data D10 may constitute fields, respectively, and a database having input data/output data records 32 consisting of the input data D13, the output data D10 and an operator field 33 may be constituted. In accordance with the database having the input data/output data records 32, the output data D10 stored in the same input data/output data record 32 can be retrieved from the operators op1 to op4 and the input data D13.

In step S5, the RTL description producing unit 6 produces the RTL description D6 based on the data path and the control information D5. In step S6, the RTL description simulating unit 11 sets the execution step 1 to be first executed to the execution step i.

In step S7, the RTL description D6 is simulated in the case where the operands i1 and i2 are 2 and 1 in the input data D13, respectively. As illustrated in FIG. 12, in the execution step 1, the input data D13 is first substituted into the RTL description D6. The storage data D11 stored in the storage elements M1 and M2 are calculated. 2 and 1 are substituted into the operands i1 and i2 in also, RTL description D6, respectively. In the execution step 1, 3 is output as the storage data D11 stored in the storage element M1, and further, 1 is output as the storage data D11 stored in the storage element M2.

In step S12, the operator op1 is retrieved from the execution step 1 of the calculated storage data D11 and the storage element M1 based on the operator/operation unit database D9 illustrated in FIG. 10. Furthermore, the operator op3 is retrieved from the execution step 1 and the storage element M2.

In step S13, it is determined whether 3 as the output data D10 from the retrieved operator op1 illustrated in FIG. 11 is equal to or different from the 3 as the storage data D11 stored in the storage element M1 in the execution step 1 illustrated in FIG. 12. The determination result is the same since 3 is equal to 3. Moreover, it is determined whether 1 as the output data D10 from the retrieved operator op3 illustrated in FIG. 11 is equal to or different from the 1 as the storage data D11 stored in the storage element M2 in the execution step 1 illustrated in FIG. 12. The determination result is the same since 1 is equal to 1. In this manner, the control routine proceeds to step S14.

In step S14, it is determined whether or not the execution step 1 is the maximum execution step 3 or greater in the optimizing data flow graph D4. Since the execution step 1 is not the maximum execution step 3 or greater, the control routine proceeds to step S15. In step S15, the execution step 1 is incremented by one, so that the execution step will be 2. In this manner, the control routine proceeds to step S7.

Again in step S7, the RTL description D6 in the execution step 2 is simulated in the case where the operands i1 and i2 in the input data D13 are 2 and 1, respectively. As illustrated in FIG. 12, in the execution step 2, 3 is output as the storage data D11 stored in the storage element M1.

In step S12, the operator op2 is retrieved from the execution step 2 and the storage element M1 based on the operator/operation unit database D9 illustrated in FIG. 10.

In step S13, it is determined whether 3 as the output data D10 from the retrieved operator op2 illustrated in FIG. 11 is equal to or different from the 3 as the storage data D11 stored in the storage element M1 in the execution step 2 illustrated in FIG. 12. The determination result is the same since 3 is equal to 3. Therefore, the control routine proceeds to step S14.

In step S14, it is determined whether or not the execution step 2 is the maximum execution step 3 or greater in the optimizing data flow graph D4. Since the execution step 2 is not the maximum execution step 3 or greater, the control routine proceeds to step S15. In step S15, the execution step 2 is incremented by one, so that the execution step will be 3. Then, the control routine proceeds to step S7.

Further, in step S7, the RTL description D6 in the execution step 3 is simulated in the case where the operands i1 and i2 in the input data D13 are 2 and 1, respectively. As illustrated in FIG. 12, in the execution step 3, 4 is output as the storage data D11 stored in the storage element M1.

In step S12, the operator op4 is retrieved from the execution step 3 and the storage element M1 based on the operator/operation unit database D9 illustrated in FIG. 10.

In step S13, it is determined whether 4 as the output data D10 from the retrieved operator op4 illustrated in FIG. 11 is equal to or different from the 4 as the storage data D11 in the storage element M1 in the execution step 3 illustrated in FIG. 12. The determination result is the same since 4 is equal to 4. Therefore, the control routine proceeds to step S14.

In step S14, it is determined whether or not the execution step 3 is the maximum execution step 3 or greater in the optimizing data flow graph D4. Since the execution step 3 is the maximum execution step 3 or greater, the design method of the logic circuit is stopped.

As described above, it can be verified that the RTL description can be accurately synthesized at a high level from the operation description by confirming that the output data D10 from the operator as the simulation result of the operation description D1 accords with the storage data D11 stored in the storage element as the simulation result of the RTL description D6 per each execution step.

[Second Embodiment]

Explanation will not be made on the simulation in which the RTL description D6 is compared per each execution step but on a simulation in which the operation description D1 and the RTL description D6 are compared and verified after the execution of all of the execution steps in the RTL description D6. Operands i1 and i2 in the input data D13 are assumed to be 3 and 2, respectively. Steps S1 to S5 and S8 to S11 in the present embodiment are the same as those in the first embodiment. Prior to execution in steps S12, S13, S16 and S17, steps S6, S7, S14 and S15 are executed. A loop in a control routine consists of steps S7, S14 and S15. As for an execution step i from an execution step 1 to a maximum execution step 3, the RTL description D6 is simulated in the case where the operands i1 and i2 in the input data D13 are 3 and 2, respectively. As illustrated in FIG. 12, first, in the execution step 1, 5 is output as the storage data D11 stored in a storage element M1, and, 1 is output as the storage data D11 stored in a storage element M2. Next, in an execution step 2, 5 is output as the storage data D11 stored in the storage element M1. Finally, in an execution step 3, 6 is output as the storage data D11 stored in the storage element M1.

In step S12, an operator op1 is retrieved from the execution step 1 of the calculated storage data D11 and the storage element M1 based on the operator/operation unit database D9 illustrated in FIG. 10. Furthermore, an operator op3 is retrieved from the execution step 1 and the storage element M2. An operator op2 is retrieved from the execution step 2 and the storage element M1. An operator op4 is retrieved from the execution step 3 and the storage element M1.

In step S13, it is determined whether 5 as the output data D10 from the retrieved operator op1 illustrated in FIG. 11 is equal to or different from the 5 as the storage data D11 stored in the storage element M1 in the execution step 1 illustrated in FIG. 12. The determination result is the same since 5 is equal to 5. Moreover, it is determined whether 1 as the output data D10 from the retrieved operator op3 illustrated in FIG. 11 is equal to or different from 1 as the storage data D11 stored in the storage element M2 in the execution step 1 illustrated in FIG. 12. The determination result is the same since 1 is equal to 1. Additionally, it is determined as to whether 5 as the output data D10 from the retrieved operator op2 illustrated in FIG. 11 is equal to or different from 5 as the storage data D11 stored in the storage element M1 in the execution step 2 illustrated in FIG. 12. The determination result is the same since 5 is equal to 5. In addition, it is determined as to whether 6 as the output data D10 from the retrieved operator op4 illustrated in FIG. 11 is equal to or different from the 6 as the storage data D11 stored in the storage element M1 in the execution step 3 illustrated in FIG. 12. The determination result is the same since 6 is equal to 6. As these determination results, the design method of the logic circuit is stopped.

As described above, it can be verified that the RTL description can be accurately synthesized at a high level from the operation description by confirming that the output data D10 from the operator as the simulation result of the operation description D1 accords with the storage data D11 stored in the storage element as the simulation result of the RTL description D6 in all of the execution steps.

[Third Embodiment]

Explanation will be made on the case where a failure occurs in the RTL description D6. Like in the first embodiment, the simulation of the RTL description D6 is carried out such that the operation description D1 and the RTL description D6 are compared and verified after execution of all of the execution steps in the RTL description D6. Operands i1 and i2 in the input data D13 are 2 and 3, respectively. Steps S1 to S5 and S8 to S11 in the third embodiment are the same as those in the first embodiment. Prior to execution in steps S12, S13, S16 and S17, steps S6, S7, S14 and S15 are executed in the third embodiment, like in the second embodiment. As illustrated in FIG. 12, first, in an execution step 1, 5 is output as the storage data D11 stored in a storage element M1, and further, −1 is output as the storage data D11 stored in a storage element M2. Next, in an execution step 2, 1275 is output as the storage data D11 stored in the storage element M1. Finally, in an execution step 3, 1276 is output as the storage data D11 stored in the storage element M1.

In step S12, an operator op1 is retrieved from the execution step 1 of the calculated storage data D11 and the storage element M1 based on the operator/operation unit database D9 illustrated in FIG. 10. Furthermore, an operator op3 is retrieved from the execution step 1 and the storage element M2. An operator op2 is retrieved from the execution step 2 and the storage element M1. An operator op4 is retrieved from the execution step 3 and the storage element M1.

In step S13, it is determined whether 5 as the output data D10 from the retrieved operator op1 illustrated in FIG. 11 is equal to or different from the 5 as the storage data D11 stored in the storage element M1 in the execution step 1 illustrated in FIG. 12. The determination result is the same since 5 is equal to 5. Moreover, it is determined whether −1 as the output data D10 from the retrieved operator op3 illustrated in FIG. 11 is equal to or different from −1 as the storage data D11 stored in the storage element M2 in the execution step 1 illustrated in FIG. 12. The determination result is the same since −1 is equal to −1. Furthermore, it is determined whether −5 as the output data D10 from the retrieved operator op2 illustrated in FIG. 11 is equal to or different from 1275 as the storage data D11 stored in the storage element M1 in the execution step 2 illustrated in FIG. 12. The determination result is different since −5 is different from 1275. Additionally, it is determined whether −4 as the output data D10 from the retrieved operator op4 illustrated in FIG. 11 is equal to or different from 1276 as the storage data D11 stored in the storage element M1 in the execution step 3 illustrated in FIG. 12. The determination result is different since −4 is different from 1276. As these determination results are different, a control routine proceeds to step S16. The determination results of the differences are produced in the retrieved operators op2 and op4.

In step S16, an operation unit A3 is retrieved from the operator op2, in which the determination result of the difference is produced, based on the operator/operation unit database D9 illustrated in FIG. 10. In the same manner, an operation unit A1 is retrieved from the operator op4, in which the determination result of the difference is produced.

In step S17, the user of the apparatus 1 for designing the logic circuit debugs the RTL description D6 based on the retrieved operation units A1 and A3. Here, a failure has occurred in the execution step 2 in the operation unit A3 earlier than in the operation unit A1. The failure occurring in the operation unit A3 may cause occurrence of a failure in the operation unit A1. In this case, the operation unit A3 is first debugged. Thus, the control routine returns to step S5. Since the control routine returns to step S5, the user can repeat the debugging operation until a debugged value of the storage data D11 stored in the storage element in the RTL description D6 is in accordance with a value of the output data D10 from the operator in the operation description D1.

As described above, the comparison and verification between the operation description D1 and the RTL description D6 enables a faulty portion in each of the operation description D1 and the RTL description D6 to be specified even in the case where the failure occurs. In this manner, it is possible to readily correct the RTL description D6. Furthermore, it is possible to remarkably shorten the time required for designing the circuit.

[Fourth Embodiment]

Also in a fourth embodiment, the design method of the logic circuit illustrated in FIG. 3 is used in the apparatus 1 for designing the logic circuit illustrated in FIG. 1. In the fourth embodiment, explanation will be made on the case where optimization is performed. In the design method of the logic circuit in the fourth embodiment, in step S1 illustrated in FIG. 3, the operation description D1 having a plurality of operators op1 to op3 illustrated in FIG. 13 is converted into the unprocessed data flow graph D2 in which operation nodes N1 to N3 for executing the operators op1 to op3, respectively, are arranged in order of execution.

Figures 13, 14, 15:
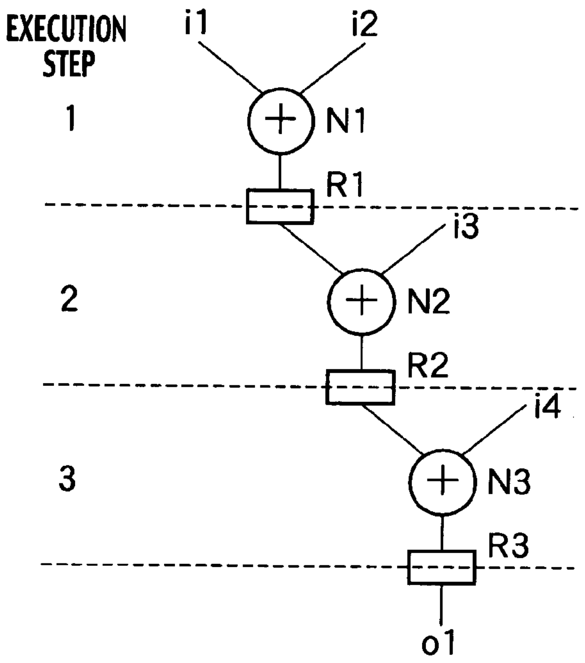
FIG. 13 illustrates an operation description in a fourth embodiment.
FIG. 14 is a diagram illustrating a DFG after scheduling in the fourth embodiment.
FIG. 15 is a table illustrating the data structure of a node/operator database before optimization in the fourth embodiment.

In step S2, execution steps 1 to 3 are allocated in the unprocessed data flow graph D2, as illustrated in FIG. 14. With respect to operands i1 and i2 in the input data D13, the operator op1 for an addition is executed at the operation node N1. Time information showing that the operation node N1 is executed in the execution step 1 is attached. A register R1 for storing therein output data from the operation node N1 is inserted after the execution of the execution step 1 in the unprocessed data flow graph D2.

The operator op2 for an addition is executed at the operation node N2 based on an output from the operator op1 at the operation node N1 and an operand i3. Time information showing that the operation node N2 is executed in the execution step 2 is attached. A register R2 for storing therein output data from the operation node N2 is inserted after the execution of the execution step 2 in the unprocessed data flow graph D2.

The operator op3 for an addition is executed at the operation node N3 based on an output from the operator op2 at the operation node N2 and an operand i4. Time information showing that the operation node N3 is executed in the execution step 3 is attached. A register R3 for storing therein output data from the operation node N3 is inserted after the execution of the execution step 3 in the unprocessed data flow graph D2.

The scheduling unit 3 outputs the unprocessed data flow graph D2, which has been processed in the above-described manner, as the scheduling data flow graph D3 illustrated in FIG. 14. Here, for the easy understanding of step S8, described later, a part of step S8 is executed in advance. The node/operator database D7 illustrated in FIG. 15 is produced based on the operation description D1 illustrated in FIG. 13 and the scheduling data flow graph D3 illustrated in FIG. 14. The operation nodes N1 to N3 and the registers R1 to R3 are stored in a node field 22. The operators op1 to op3 are stored in an operator field 23. The operators op1 to op3 and the operation nodes N1 to N3 for executing the operators op1 to op3 are stored in the same node/operator records 21, respectively. Furthermore, the operators op1 to op3 and the registers R1 to R3 for storing therein the output data from the operators op1 to op3 are stored in the same node/operator records 21, respectively.

Figures 16, 17:
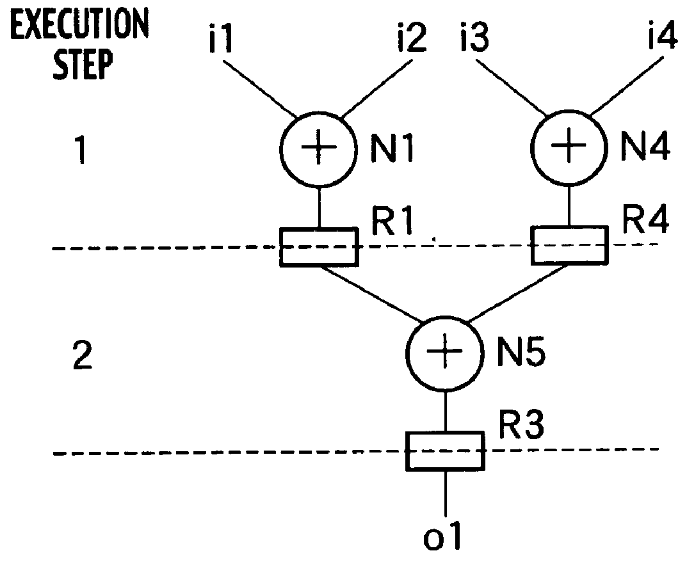
FIG. 16 is a diagram illustrating a DFG after the optimization in the fourth embodiment.
FIG. 17 is a table illustrating the data structure of a node/operator database after the optimization in the fourth embodiment.

In step S3, the scheduling data flow graph D3 illustrated in FIG. 14 is optimized as illustrated in FIG. 16, thereby producing the optimizing data flow graph D4. The additions which are processed in series are recombined in such a manner as to be processed in parallel. The operation nodes N2 and N3 and the register R2 are erased; in turn, operation nodes N4 and N5 and a register R4 are produced. The expected entire execution time is shortened from three execution steps to two execution steps.

In step S8, the node/operator database D7 illustrated in FIG. 15 is first produced based on the operation description D1 illustrated in FIG. 13, the scheduling data flow graph D3 illustrated in FIG. 14 and the optimizing data flow graph D4 illustrated in FIG. 16, and further, the node/operator database D7 illustrated in FIG. 17 is produced.

The operation nodes N1 to N5 and the registers R1 to R4 are stored in the node field 22. The operators op1 to op3 are stored in the operator field 23. The operators op1 to op3 and the operation nodes N1 to N4 for executing the operators op1 to op3 are stored in the same node/operator records 21, respectively. Neither of the operation nodes N2 and N3 directly corresponding to the operators op2 and op3, respectively, exists in the optimizing data flow graph D4 illustrated in FIG. 16. Thus, the operation nodes N4 and N5 are set as the operation nodes which contribute to the execution of the operators op2 and op3. The operators op2 and op3 and the operation node N4 which contributes to the execution of the operators op2 and op3 are stored in the same operator record 21. Furthermore, the operators op2 and op3 and the operation node N5 which contributes to the execution of the operators op2 and op3 are stored in the same operator record 21.

Moreover, the operation node N1 and the register R1 corresponding to the operation node N1 are related to the operator op1. The operation node N4 and the register R4 corresponding to the operation node N4 are related to the operators op2 and op3. The operation node N5 and the register R3 corresponding to the operation node N5 are related to the operators op2 and op3.

Figures 18, 19, 20:
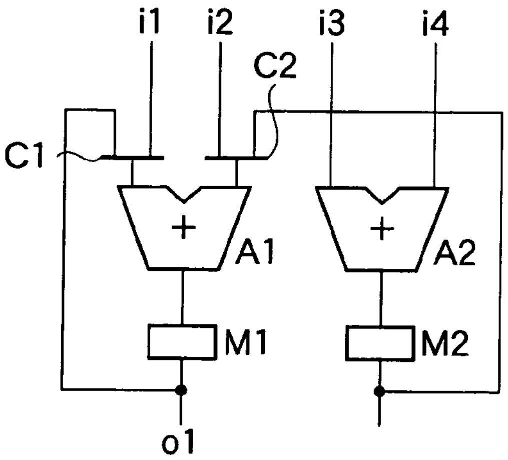
FIG. 18 is a diagram illustrating a data path in the fourth embodiment.
FIG. 19 is a table illustrating the data structure of a node/operation unit database in the fourth embodiment.
FIG. 20 is a table illustrating the data structure of an operator/operation unit database in the fourth embodiment.

In step S4, the data path D5 in the logic circuit and the control information D5 on the data path are produced, as illustrated in FIG. 18. The data path D5 includes an operation unit A1, an operation unit A2, a storage element M1, a storage element M2, a selector C1 and a selector C2. The operation unit A1 functions as the operation nodes N1 and N5. The operation unit A2 functions as the operation node N4. The storage element M1 functions as the registers R1 and R3. The storage element M2 functions as the register R4. The selectors C1 and C2 switch data to be transmitted based on the control information D5.

In step S9, the node/operation unit database D8 illustrated in FIG. 19 is produced based on the optimizing data flow graph D4 illustrated in FIG. 16 and the data path D5 illustrated in FIG. 18. In the execution step 1, based on the node/operation unit database D8 illustrated in FIG. 19, the operation unit A1 functions as the operation node N1; the operation unit A2 functions as the operation node N4; the storage element M1 functions as the register R1; and the storage element M2 functions as the register R4. In the execution step 2, the operation unit A1 functions as the operation node N5; and the storage element M1 functions as the register R3.

In step S10, the operator/operation unit database D9 illustrated in FIG. 20 is produced based on the node/operator database D7 illustrated in FIG. 17 and the node/operation unit database D8 illustrated in FIG. 19. Upon study of the operator/operation unit database D9 illustrated in FIG. 20, in the execution step 1, the operation unit A1 functions as the operator op1; the operation unit A2 functions as the operators op2 and op3; the storage element M1 stores therein data output from the operator op1; and the storage element M2 stores therein data output from the operators op2 and op3. In the execution step 2, the operation unit A1 functions as the operators op2 and op3; and the storage element M1 stores therein data output from the operator op3.

In accordance with the operator/operation unit database D9 illustrated in FIG. 20, the operation units A1 and A2 stored in the same operator/operation unit records 28 can be retrieved from the operators op1 to op3. Furthermore, the operators op1 to op3 stored in the same operator/operation unit record 28 can be retrieved from the storage elements M1 and M2 and the execution steps 1 and 2. For example, the operator op1 can be retrieved from the storage element M1 and the execution step 1; the operation unit A1 can be retrieved from the operator op1; the operators op2 and op3 can be retrieved from the storage element M2 and the execution step 1; and the operation unit A2 can be retrieved from the operators op2 and op3 and the execution step 1.

In this manner, when the RTL description D6 is produced from the operation description D1, the operator/operation unit database D9 for allowing the operation description D1 and the RTL description D6 to correspond to each other can be produced, thereby comparing and verifying the operation description D1 and the RTL description D6. In the case where a failure occurs, faulty portions can be specified in both of the operation description D1 and the RTL description D6 by the comparison and verification. Thus, it is possible to readily correct the operation description D1 or the RTL description D6.

As described above, according to the present embodiments, it is possible to provide the design method of the logic circuit for speedily analyzing the simulation result of the logic circuit in the RTL description, which has been converted from the operation description.

Furthermore, according to the present embodiments, it is possible to provide the design program of the logic circuit, which is executed by a computer in order to speedily analyze the simulation result of the logic circuit in the RTL description, which has been converted from the operation description.

Moreover, according to the present embodiments, it is possible to provide the apparatus for designing the logic circuit for speedily analyzing the simulation result of the logic circuit in the RTL description, which has been converted from the operation description.

The present invention may be embodied in other specific forms without departing from the spirit or essential characteristics thereof. The embodiments are therefore to be considered in all respects as illustrative and not respective, the scope of the present invention being indicated by the appended claims rather than by the foregoing description, and all changes which come within the meaning and range of equivalency of the claims are therefore intended to be embraced therein.

What is claimed is:

1. A computer-implemented design method of a logic circuit comprising:

converting an algorithm of the logic circuit from an operation description having operators into a data flow graph having operation nodes executing the operators arranged in order of the executing;

allocating execution steps in the data flow graph, and inserting registers storing output data from the operation nodes after execution of the execution steps;

producing a data path of the logic circuit having operation units which served as the operation nodes and storage elements which served as the registers, and control information on the data path; and producing an operator/operation unit database configured to retrieve the operation units executing the operators from the operators and configured to retrieve the operators outputting data stored in the registers which served as the storage elements from the execution steps and the storage elements.

2. The computer-implemented design method of a logic circuit as claimed in claim 1, further comprising:

producing a node/operator database configured to retrieve the operators executed at the operation nodes from the operation nodes based on the operation description and the data flow graph and configured to retrieve the operators executed at the operation nodes outputting data stored in the registers from the registers; and producing a node/operation unit database configured to retrieve the operation unit which served as the operation node from the operation nodes based on the data flow graph and the data path and configured to retrieve the registers which served as the storage elements from the execution step and the storage elements;

wherein the operator/operation unit database is produced based on the node/operator database and the node/operation unit database.

3. The computer-implemented design method of a logic circuit as claimed in claim 1, further comprising:

producing a register transfer level description of the logic circuit based on the data path and the control information;

substituting input data into the operation description, and calculating output data from the operators;

substituting the input data into the register transfer level description, and calculating storage data stored in the storage elements in the execution step;

retrieving the operators from the execution step and the storage elements of the calculated storage data based on the operator/operation unit database; and determining whether the output data from the operators and the storage data are the same as or different from each other.

4. The computer-implemented design method of a logic circuit as claimed in claim 1, further comprising:

retrieving the operation unit from the operators based on the operator/operation unit database.

5. A computer program product to be executed by a computer for designing a logic circuit, the computer program product comprising:

instructions configured to convert an algorithm of the logic circuit from an operation description having operators into a data flow graph having operation nodes executing the operators arranged in order of the executing;

instructions configured to allocate execution steps in the data flow graph, and inserting registers storing output data from the operation nodes after execution of the execution steps;

instructions configured to produce a data path of the logic circuit having operation units which served as the operation nodes and storage elements which served as the registers, and control information on the data path; and instructions configured to produce an operator/operation unit database configured to retrieve the operation units executing the operators from the operators and to retrieve the operators outputting data stored in the registers which served as the storage elements from the execution steps and the storage elements.

6. The computer program product to be executed by a computer as claimed in claim 5, further comprising:

instructions configured to produce a node/operator database configured to retrieve the operators executed at the operation nodes from the operation nodes based on the operation description and the data flow graph and to retrieve the operators executed at the operation nodes outputting data stored in the registers from the registers; and instructions configured to produce a node/operation unit database configured to retrieve the operation unit which served as the operation nodes from the operation nodes based on the data flow graph and the data path and to retrieve the registers which served as the storage elements from the execution step and the storage elements;

wherein the operator/operation unit database is produced based on the node/operator database and the node/operation unit database.

7. The computer program product to be executed by a computer as claimed in claim 5, further comprising:

instructions configured to produce a register transfer level description of the logic circuit based on the data path and the control information;

instructions configured to substitute input data into the operation description, and to calculate output data from the operators;

instructions configured to substitute the input data into the register transfer level description, and to calculate storage data stored in the storage elements in the execution step;

instructions configured to retrieve the operators from the execution step and the storage elements of the calculated storage data based on the operator/operation unit database; and instructions configured to determine whether the output data from the operators and the storage data are the same as or different from each other.

8. The computer program product to be executed by a computer as claimed in claim 5, further comprising:

instructions configured to retrieve the operation unit from the operators based on the operator/operation unit database.

9. An apparatus for designing a logic circuit comprising:

a syntax analyzing unit configured to convert an algorithm of the logic circuit from an operation description having operators into a data flow graph having operation nodes executing the operators arranged in order of the executing;

a scheduling unit configured to allocate execution steps in the data flow graph, and inserting registers storing output data from the operation nodes after execution of the execution steps;

a hardware allocating unit configured to produce a data path of the logic circuit having operation units which served as the operation nodes and storage elements which served as the registers, and control information on the data path; and a correspondence information analyzing unit configured to produce an operator/operation unit database configured to retrieve the operation units executing the operators from the operators and to retrieve the operators outputting data stored in the registers served as the storage elements from the execution steps and the storage elements.

10. The apparatus for designing a logic circuit as claimed in claim 9, further comprising:

a node/operator correspondence information analyzing unit configured to produce a node/operator database configured to retrieve the operators executed at the operation nodes from the operation nodes based on the operation description and the data flow graph and to retrieve the operators executed at the operation nodes outputting data stored in the registers from the registers; and a node/operation unit correspondence information analyzing unit configured to produce a node/operation unit database configured to retrieve the operation unit which served as the operation nodes from the operation nodes based on the data flow graph and the data path and to retrieve the registers which served as the storage elements from the execution step and the storage elements;

wherein the operator/operation unit database is produced based on the node/operator database and the node/operation unit database.

11. The apparatus for designing a logic circuit as claimed in claim 9, further comprising:

a register transfer level description producing unit configured to produce a register transfer level description of the logic circuit based on the data path and the control information;

an operation description simulating unit configured to substitute input data into the operation description, and to calculate output data from the operators;

a register transfer level simulating unit configured to substitute the input data into the register transfer level description, and to calculate storage data stored in the storage elements in the execution step;

an operator retriever configured to retrieve the operators from the execution step and the storage elements of the calculated storage data based on the operator/operation unit database; and a storage data determiner configured to determine whether the output data from the operators and the storage data are the same as or different from each other.

12. The apparatus for designing a logic circuit as claimed in claim 9, further comprising:

an operation unit retriever configured to retrieve the operation unit from the operators based on the operator/operation unit database.

* * * * *